United States Patent [19]

Hyde

[11] 4,365,506
[45] Dec. 28, 1982

[54] REMOTELY OPERATED DOWNHOLE TEST DISCONNECT SWITCHING APPARATUS

[75] Inventor: Robert L. Hyde, Bartlesville, Okla.

[73] Assignee: TRW Inc., Cleveland, Ohio

[21] Appl. No.: 219,250

[22] Filed: Dec. 22, 1980

[51] Int. Cl.³ ............................................. E21B 47/00
[52] U.S. Cl. ..................................... 73/151; 318/490; 337/333
[58] Field of Search ................ 73/151; 324/54, 415, 324/417; 318/490; 340/856; 335/141, 143, 145; 337/333; 417/63

[56] References Cited

U.S. PATENT DOCUMENTS

| | | | |
|---|---|---|---|
| 2,073,585 | 3/1937 | Parissi | 179/84 |
| 2,263,389 | 11/1941 | Koenig | 177/352 |
| 2,287,164 | 6/1942 | Bowsher | 177/352 |
| 2,305,862 | 12/1942 | Gilliver et al. | 177/352 |
| 2,357,995 | 9/1944 | Blomberg et al. | 177/352 |
| 2,622,170 | 12/1952 | Van Toorn | 335/145 X |
| 3,021,520 | 2/1962 | Weber | 340/384 |
| 3,171,116 | 4/1965 | Conigliaro | 340/281 |
| 3,284,669 | 11/1966 | Boyd | 317/13 |
| 4,178,579 | 12/1979 | McGibbeny et al. | 340/856 |

Primary Examiner—Jerry W. Myracle
Attorney, Agent, or Firm—Shapiro and Shapiro

[57] ABSTRACT

A remotely controlled switching apparatus for selectively controlling the connection of a downhole device to a power cable which carries power to a downhole motor includes a thermostatic switch connected between the device and the cable, and a heater for producing sufficient heat to raise the temperature of the switch above its operating temperature. The heater is operated by a switching signal impressed upon the cable by a control and readout unit on the surface. The apparatus may be used to disconnect the device from the cable for a predetermined period of time to enable high voltage testing. After the predetermined period of time, the apparatus automatically reconnects the device to the cable.

15 Claims, 5 Drawing Figures

REMOTELY OPERATED DOWNHOLE TEST DISCONNECT SWITCHING APPARATUS

BACKGROUND OF THE INVENTION

This invention relates generally to oil well monitor systems, and more particularly to remotely controlled downhole switching apparatus for use in such systems.

There are many industrial installations in which it is desirable to selectively connect remotely disposed, and often inaccessible, devices to a cable by means of control signals impressed upon the cable. In oil well monitor systems, for example, in which a downhole instrumentation package is used to monitor various physical parameters in the downhole environment, such as temperature and pressure, it is common practice to employ the cable which carries power to a downhole AC motor driving a submersible pump to carry DC signals between the downhole instrumentation package and a control and readout unit on the surface. Normally, a three-phase, Y-connected motor is employed in such installations, and the DC signals are coupled to the neutral of a three-phase power source driving the cable and from the neutral of the motor to the instrumentation package. In order to monitor the condition of the downhole motor, it is desirable to measure periodically the motor/cable system insulation to ground resistance, since this gives an early indication of impending failure. Such measurements require the use of relatively high voltages, e.g., 500 volts or more. However, since the downhole instrumentation package transducers and their associated circuits generally have a much lower impedance to ground than the motor/cable insulation system, it is necessary to disconnect the instrumentation package from the cable prior to testing, and, subsequently, to reconnect the instrumentation package when testing has been completed. Accordingly, various downhole latch/delatch systems have been proposed.

One such system is disclosed in U.S. Pat. No. 4,178,579 to McGibbeny, et al., issued Dec. 11, 1979, and assigned to the same assignee as the present invention. In the McGibbeny, et al. system, the downhole instrumentation package is selectively connected to the neutral of the three-phase motor by a reed switch, which may be opened by the application of a negative voltage of a predetermined magnitude to the cable. The negative voltage causes a Zener diode to break down and allows current to flow in a delatch coil, opening the reed switch. The magnetic flux produced by the delatch coil is sufficient to overcome the flux of a permanent magnet which, while of insufficient magnitude to close the reed switch, is of sufficient magnitude to hold the reed switch in closed position once it is closed. To relatch the reed switch after it has been opened, a latch coil, whose magnetic flux adds to that of the permanent magnet, is energized by the rectified AC current flowing in the secondary of a current transformer whose primary is one of the three-phase lines to the motor.

Although the McGibbeny, et al. latch/delatch system performs satisfactorily, it employs a relatively large number of components and is relatively complex, expensive and bulky. Moreover, because of the high temperature/high pressure downhole environment, the components, particularly the semiconductor components, of such systems are more subject to failure. Therefore, in systems such as the McGibbeny, et al. system, it is difficult to achieve the desired degree of reliability. Many prior downhole switching systems suffer from these disadvantages.

SUMMARY OF THE INVENTION

The present invention provides a relatively simple, inexpensive and reliable remotely controlled switching apparatus, which is particularly adapted for selectively controlling the connection of a downhole device to a cable which carries power to a downhole motor to enable high voltage testing of the motor. The switching apparatus of the invention employs only a few components, which are small, highly reliable, and easily assembled. It is readily adaptable to existing downhole systems, and it requires only two external connections between the cable and the device.

The switching apparatus may be constructed so that it is normally closed, connecting the device to the cable, and upon the application of a switching signal, the switching apparatus opens to disconnect the device and remains open for a sufficient period of time to allow testing. Thereafter, the switching apparatus automatically recloses.

Briefly stated, in one aspect, a remotely controlled switching apparatus in accordance with the invention for selectively controlling the connection of a downhole device to a cable which carries power to a downhole motor may include temperature responsive switch means connected between the device and the cable, the switch means being in a first state when its temperature is below a predetermined temperature and being in a second state when its temperature is above the predetermined temperature. Means are provided for impressing a switching signal onto the cable, and heater means responsive to the switching signal are included for producing sufficient heat to raise the temperature of the switch means above the predetermined temperature.

In accordance with another aspect, the invention provides a remotely controlled switching apparatus for temporarily disconnecting a downhole DC device from a cable which carries power to a downhole AC motor which includes an AC blocking circuit, a thermostatic switch and a resistance heater connected in series between the cable and the device. The thermostatic switch is normally closed and is effective to electrically connect the device to the cable. The resistance heater is thermally coupled to the thermostatic switch and is responsive to a DC current flowing through the heater from the cable for generating sufficient heat to open the thermostatic switch.

DETAILED DESCRIPTION OF THE PREFERRED EMBODIMENT

Although the invention is applicable to many systems which require an apparatus for selectively controlling the connection of a remotely disposed device to a cable, the invention is particularly applicable to a downhole oil well monitor system and will be described in that environment. It is understood, however, that this environment is only illustrative of the utility of the invention.

Figure 1:
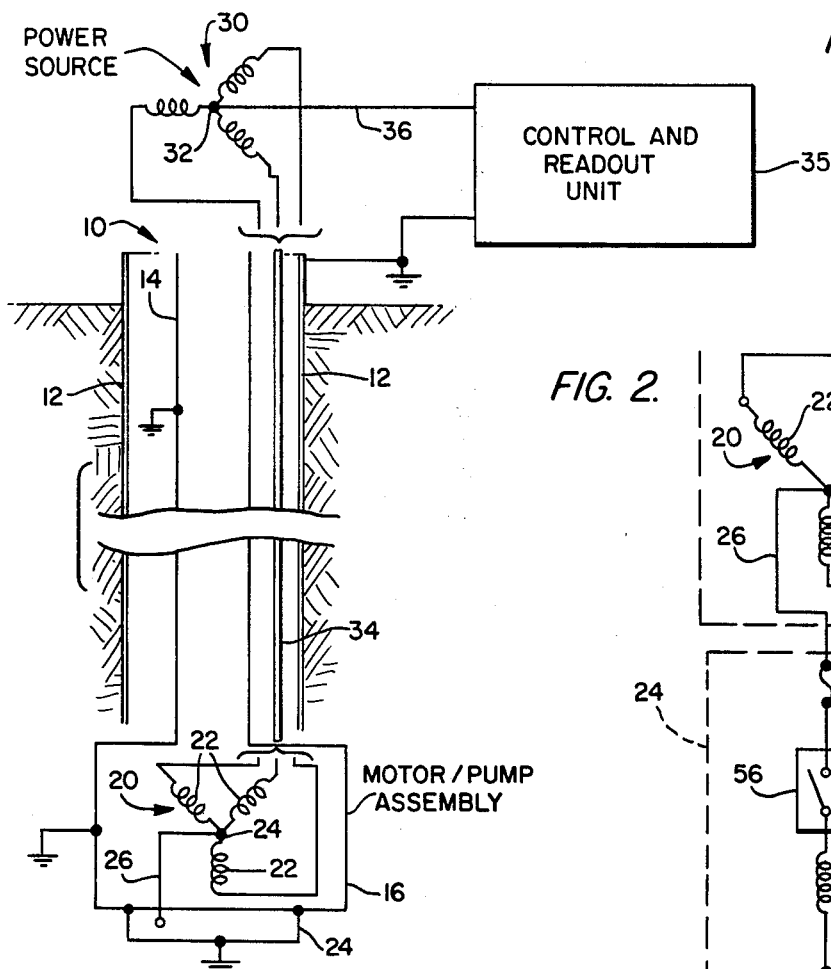
FIG. 1 is a diagrammatic view illustrating a system embodying the invention.

FIG. 1 illustrates an oil well system embodying the invention. As shown, the system includes a bore hole 10, having a casing or liner 12 and a tubing string 14 disposed within the bore hole. A downhole submersible motor/pump assembly 16 may be connected to the lower end of the tubing string 14 for pumping fluids to the surface. The motor 20 of assembly 16 may be a three-phase AC motor having three Y-connected windings 22 and an ungrounded neutral node 24 (the pump is not illustrated). An instrumentation package 24 may be mechanically coupled to the housing of the motor/pump assembly 16 and electrically connected to the neutral node 24 of the motor by an electrical conductor 26. The motor/pump assembly housing and the instrumentation package housing, as well as casing 12 and tubing string 14, are electrically connected to earth ground.

On the surface, power may be supplied to the motor from a three-phase, Y-connected AC power source 30 having an ungrounded neutral node 32, via a power cable 34 which extends downhole between the tubing string 14 and the casing 12. A control and readout unit 35 may be connected to earth ground and to neutral node 32 of power source 30 by an electrical conductor 36. Accordingly, the downhole instrumentation package 24 is electrically connected to the control and readout unit 35 by electrical conductors 26 and 36 and by power cable 34, the return path being earth ground. As is well known, the control and readout unit 35 may contain DC voltage and current sources for controlling the transducers, i.e., devices, in the instrumentation package 24 and for reading out the data therefrom. In addition, as will be explained, the control and readout unit includes means for generating a switching signal, which is preferably a DC voltage, for selectively controlling the connection of the instrumentation package 24 to power cable 34.

Figure 2:
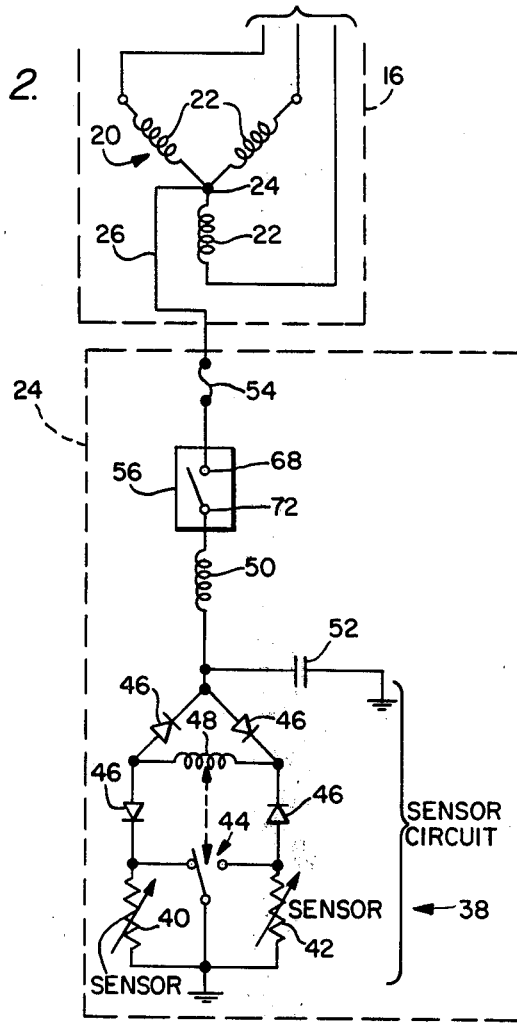
FIG. 2 is a schematic diagram of the downhole portion of the system of FIG. 1.

FIG. 2 illustrates in more detail the downhole portion of the system of FIG. 1. As shown, the downhole instrumentation package 24 includes a sensor circuit 38 comprising a plurality of sensors 40, 42 which monitor physical parameters, such as pressure and temperature, in the downhole environment. The sensors may be variable resistance transducers, the resistances of which vary in accordance with the parameters being sensed. Sensor circuit 38 may also include a single-pole double-throw switch 44 for selectively bypassing each of the sensors, a plurality of steering diodes 46 which establish different electrical current paths through the circuit for different polarity DC currents, and a relay coil 48 which is used for controlling the position of switch 44.

Sensor circuit 38 and the portion of the control and readout unit 35 used for controlling the sensor circuit and for reading the data therefrom are preferably the same as those described in the previously mentioned McGibbeny, et al. patent, the disclosure of which is incorporated by reference herein. Accordingly, the construction and the operation of these devices will not be described, and reference may be had to the McGibbeny, et al. patent for such details. It is sufficient for present purposes to note, however, that sensor circuit 38 is controlled, and that data from the sensors is readout, by the application to the sensor circuit of DC voltages and currents of predetermined magnitudes and polarities, which are generated in the control and readout unit 35. The DC voltages and currents are carried on the power cable 34, and the sensor circuit is isolated from the AC power on the cable by an AC blocking circuit (low pass filter) comprising an inductor 50 and a capacitor 52. A fuse 54 is also included for decoupling the instrumentation package 24 from the cable in the event of a failure, e.g., a short circuit in either the sensor circuit or in the motor windings.

As previously indicated, the instrumentation package 24 may be normally connected to the power cable 34, so that the physical parameters of the downhole environment can be monitored continuously. However, when it is desired to perform an insulation resistance test of the motor/cable system, it is necessary to disconnect the instrumentation package from the cable. For this purpose, the invention provides a switching device 56 which may be controlled to open the electrical connection between the instrumentation package and the neutral node 24 of the motor, in a manner which will now be described.

Figure 3:
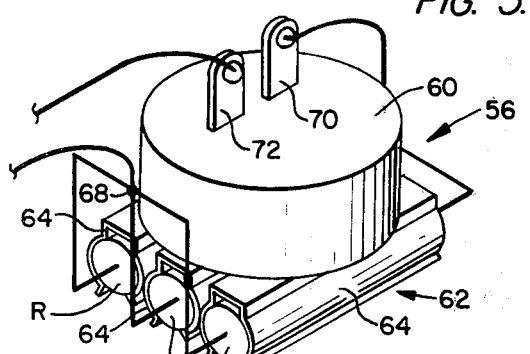
FIG. 3 is a perspective view of a temperature responsive switch and heater employed in the invention.
Figure 4:
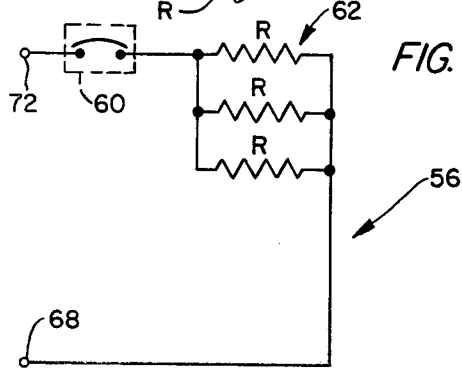
FIG. 4 is a schematic diagram of the device of FIG. 3.
Figure 5:
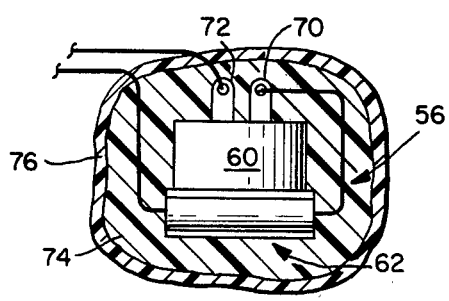
FIG. 5 is a sectional view illustrating the device of FIG. 3 embedded in an insulation medium.

As shown in FIGS. 3-5, switching device 56 preferably comprises a thermostatic switch 60 electrically connected in series with a resistance heater 62 and thermally coupled thereto. Thermostatic switch 60 is preferably a normally closed switch which opens when its temperature is increased beyond a predetermined opening temperature. Since the normal temperature of the downhole environment is approximately 250°-350° F., thermostatic switch 60 may be conveniently selected to open at a temperature of approximately 400° F.

As illustrated in FIGS. 3-5, resistance heater 62 may comprise a plurality of parallel-connected resistors R. The resistors may be mounted in metallic clips 64 which are attached to the base of thermostatic switch 60. The leads on one side of the resistors may be connected together electrically as at 68 to form one terminal of switching device 56. The leads on the other side of the resistors may be electrically connected together and to one terminal 70 of the thermostatic switch 60, the other terminal 72 of the thermostatic switch being a second terminal of switching device 56. If desired, thermostatic switch 60 and resistors R may be mounted on a printed circuit board and the electrical connections between the switch and the resistors made thereon. Because of the relatively high temperature of the downhole environment, all of the electrical connections to the thermostatic switch and to the resistors are preferably made with high temperature solder. Switching device 56 may be connected in series with fuse 54 and inductor 50 between the motor/cable and the sensor circuit 38 of the instrumentation package 24, in the manner illustrated in FIG. 2.

When a voltage is applied to terminals 68 and 72 of switching device 56, the current flowing through the parallel resistors produces a voltage drop and heat is generated. By controlling the magnitude of the current flow, and by selecting the values of the resistors, sufficient heat can be produced to increase the temperature of the thermostatic switch 60 above its opening temperature. For example, if each of the three resistors R is a 5 watt, 3,000 ohm resistor, the equivalent parallel resistance is 1,000 ohms. If a DC switching signal of 100 volts is applied between terminals 68 and 72, the power dissipation in the resistors will be 10 watts, which, after a sufficient period of time, could easily increase the temperature of the thermostatic switch from a normal operating temperature of approximately 250°–350° F. to an opening temperature of 400° F.

When the thermostatic switch 60 opens, the current flow through the resistance heater 62 is interrupted. As the heat which was produced by the current flow through the heater is dissipated into the surrounding medium, the temperature of the thermostatic switch decreases. When its temperature falls below the opening temperature (minus a small hysteresis differential), the thermostatic switch automatically closes. The time (t) required for the temperature of the thermostatic switch to decrease to the opening temperature (T) due to dissipation of the heat into the surrounding medium may be found from the equation $$T = T_{max} e^{-t/RC}$$

where $T_{max}$ is the temperature to which the switch was heated, and R and C are the thermal resistance and thermal capacitance, respectively, of the surrounding medium. By controlling (i.e., limiting) the rate at which the heat is dissipated, the thermostatic switch can be held open for a sufficient period of time to permit insulation resistance testing to be performed. This may be accomplished in the following manner.

As shown in FIG. 5, the thermostatic switch 60 and the resistance heater 62 are preferably insulated from the surrounding medium by wrapping them in fiberglass 74 and an outer layer of teflon and acrylic adhesive tape 76. Alternatively, the thermostatic switch and the resistance heater may be embedded in plastic, such as epoxy resin. When installed in the instrumentation package, the insulated switch device 56 is immersed in mineral oil, which is the normal internal environment of the motor/pump assembly and the instrumentation package. The insulation also serves to isolate the switching device from convection currents in the mineral oil, which would increase the rate of heat dissipation. The insulated switching device may also be included in a vacuum bottle, if desired, to provide even better insulation and a longer open time.

In operation, when it is desired to perform an insulation resistance test, the control and readout unit 35 generates a DC voltage switching signal which is impressed upon the power cable 34 via conductor 36 and carried to the switching device. This DC voltage may be between 100 and 250 volts DC, for example. The current flow through the resistance heater 62 produced by the voltage causes the heater to generate heat that increases the temperature of the thermostatic switch 60 above its opening temperature (Inductor 50 of the AC blocking circuit attenuates AC current through the heater sufficiently to prevent operation of the switch). As previously mentioned, the opening temperature is preferably approximately 400° F. This causes the switching device to open, disconnecting the sensor circuit from the power cable. When the switching device opens, the switching signal from the control and readout unit may be terminated. Insulation resistance testing can then be performed. Preferably, the thermal insulation of the switching device is such that the thermostatic switch 60 remains open for approximately 5 minutes, which is sufficient for testing. When sufficient heat has been dissipated so that the temperature of the thermostatic switch decreases below its opening temperature, the thermostatic switch automatically recloses, reconnecting the sensor circuit to the cable.

From the foregoing, it may be appreciated that the invention provides a relatively simple, inexpensive and reliable switching apparatus which avoids many of the disadvantages of prior such apparatus. While a preferred embodiment of the invention has been shown and described, it will be apparent to those skilled in the art that changes can be made in this embodiment without departing from the principles and spirit of the invention, the scope of which is defined in the appended claims. For example, it is within the contemplation of the invention that the switching device can be used to disconnect the sensor circuit from the power cable in the event a phase unbalance occurs on the cable which is large enough to produce sufficient AC current flow through conductor 26 to actuate the thermostatic switch.

The invention claimed is:

1. A remotely controlled switching apparatus for selectively controlling the connection of a downhole device to a cable which carries power to a downhole motor comprising temperature responsive switch means connected between the device and the cable, said switch means being in a first state when its temperature is below a predetermined temperature and being in a second state when its temperature is above the predetermined temperature, means for impressing a switching signal onto the cable, and heater means responsive to the switching signal for producing sufficient heat to raise the temperature of the switch means above said predetermined temperature.

2. The apparatus of claim 1, wherein the switch means is closed in the first state when its temperature is below the predetermined temperature, thereby connecting the device to the cable, and is open in the second state when its temperature is above the predetermined temperature, thereby disconnecting the device from the cable.

3. The apparatus of claim 2, wherein the heater means and the switch means are connected in series between the cable and the device such that when the switch means opens, the current flow through the heater means is interrupted.

4. The apparatus of claim 1, wherein the heater means is a resistance heater which produces heat when the switching signal flows therethrough.

5. The apparatus of claim 4, wherein the switch means is a thermostatic switch and the resistance heater comprises a plurality of parallel connected resistors thermally coupled to the switch.

6. The apparatus of claim 1, further comprising thermal insulation means enclosing the switch means and the heater means for controlling the rate at which heat is dissipated to the surrounding medium.

7. The apparatus of claim 6, wherein the thermal insulation means comprises fiberglass.

8. The apparatus of claim 6, wherein the switch means and heater means are embedded in plastic.

9. The apparatus of claim 6, wherein the surrounding medium is mineral oil.

10. The apparatus of claim 1, wherein the power carried by the cable is AC power and the switching signal is a DC voltage, and wherein the apparatus further comprises an AC blocking circuit in series with the heater means.

11. The apparatus of claim 10, wherein the heat produced by the heater means is controlled by the magnitude of the switching signal.

12. A remotely controlled switching apparatus for temporarily disconnecting a downhole DC device from a cable which carries power to a downhole AC motor comprising an AC blocking circuit, a thermostatic switch and a resistance heater series connected between the cable and the device, the thermostatic switch being normally closed and effective to connect the device to the cable, and the resistance heater being thermally coupled to the thermostatic switch and being responsive to a DC current flowing through the heater from the cable for generating sufficient heat to open the thermostatic switch.

13. The apparatus of claim 12, further comprising means for controlling the rate of heat dissipation from the thermostatic switch and the resistance heater to the surrounding medium.

14. The apparatus of claim 13, wherein the controlling means comprises thermal insulation surrounding the thermostatic switch and the resistance heater.

15. The apparatus of claim 12, wherein the resistance heater comprises a plurality of parallel connected resistors mounted on the thermostatic switch.

* * * * *